(12) United States Patent
Kim et al.

(10) Patent No.: US 10,600,854 B2
(45) Date of Patent: Mar. 24, 2020

(54) DISPLAY DEVICE WITH PROTECTION AND ENCAPSULATION LAYERS TO SEAL DISPLAY UNIT

(71) Applicant: SAMSUNG DISPLAY CO., LTD., Yongin-si, Gyeonggi-do (KR)

(72) Inventors: Kihoon Kim, Yongin-si (KR); Deukjong Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 21 days.

(21) Appl. No.: 15/333,633

(22) Filed: Oct. 25, 2016

(65) Prior Publication Data
US 2017/0287995 A1    Oct. 5, 2017

(30) Foreign Application Priority Data
Apr. 4, 2016  (KR) .................. 10-2016-0041255

(51) Int. Cl.
*H01L 27/32*     (2006.01)
*H01L 51/52*     (2006.01)

(52) U.S. Cl.
CPC ...... *H01L 27/3258* (2013.01); *H01L 27/3276* (2013.01); *H01L 51/5253* (2013.01)

(58) Field of Classification Search
CPC ............. H01L 51/5253; H01L 27/3258; H01L 27/3276
See application file for complete search history.

(56) References Cited

U.S. PATENT DOCUMENTS 7,936,122 B2  5/2011 Izumi et al.
7,944,140 B2  5/2011 Kwak et al.
(Continued)

FOREIGN PATENT DOCUMENTS

EP   1796171    6/2007
EP   2019432    1/2009
(Continued)

OTHER PUBLICATIONS

European Search Report dated Aug. 28, 2017 which corresponds to European Appln. No. 17153914.1.
(Continued)

*Primary Examiner* — Thao X Le
*Assistant Examiner* — Xia L Cross
(74) *Attorney, Agent, or Firm* — F. Chau & Associates, LLC

(57) ABSTRACT

A display device includes a substrate, a display unit disposed over the substrate, and an encapsulation layer sealing the display unit. The display unit includes a thin film transistor, a display element electrically connected to the thin film transistor, a protection layer, and a planarization layer. The protection layer and the planarization layer are disposed between the thin film transistor and the display element. The display unit includes a display area and a non-display area outside the display area. The non-display area includes a voltage line. The planarization layer includes a dividing region dividing the planarization layer into a center portion and an outer portion. The dividing region surrounds the display area. The voltage line is partially disposed in the dividing region. The protection layer at least covers the sides of the voltage line disposed in the dividing region.

18 Claims, 7 Drawing Sheets

(56) References Cited

U.S. PATENT DOCUMENTS

| | | | |
|---|---|---|---|
| 8,203,264 | B2 | 6/2012 | Kang et al. |
| 9,000,428 | B2 | 4/2015 | Lee et al. |
| 9,366,927 | B2 | 6/2016 | Jung |
| 2007/0132365 | A1* | 6/2007 | Kang ................ H01L 27/3258 313/500 |
| 2007/0145889 | A1* | 6/2007 | Tamura ............. H01L 51/5281 313/504 |
| 2008/0024479 | A1* | 1/2008 | Jung .................. H01L 27/322 345/211 |
| 2009/0026932 | A1* | 1/2009 | Kwak ................ H01L 27/3272 313/504 |
| 2012/0133275 | A1 | 5/2012 | Lee et al. |
| 2012/0256973 | A1 | 10/2012 | Choi et al. |
| 2014/0291641 | A1* | 10/2014 | Negishi ............. H01L 51/5253 257/40 |
| 2015/0123084 | A1* | 5/2015 | Kim .................. H01L 27/326 257/40 |
| 2016/0307988 | A1* | 10/2016 | Kim .................. H01L 27/3262 |

FOREIGN PATENT DOCUMENTS

| | | |
|---|---|---|
| KR | 1020060001377 | 1/2006 |
| KR | 1020090064320 | 6/2009 |
| KR | 1020140106851 | 9/2014 |
| KR | 1020140133053 | 11/2014 |

OTHER PUBLICATIONS

European Search Report dated Nov. 26, 2019 which corresponds to European Appln. No. 19196040.0.

\* cited by examiner

DISPLAY DEVICE WITH PROTECTION AND ENCAPSULATION LAYERS TO SEAL DISPLAY UNIT

CROSS-REFERENCE TO RELATED APPLICATION

This application claims priority under 35 U.S.C. § 119 to Korean Patent Application No. 10-2016-0041255, filed on Apr. 4, 2016 in the Korean Intellectual Property Office, the disclosure of which is incorporated by reference herein in its entirety.

TECHNICAL FIELD

Exemplary embodiments of the inventive concept relate to a display device with protection and encapsulation layers to seal a display unit.

DISCUSSION OF RELATED ART

In recent years, flat panel display devices have become popular due to excellent characteristics such as a slim profile, light weight, and low power consumption.

A flexible display device having a slim profile include a thin film encapsulation layer to block penetration of moisture, oxygen, etc. from the outside. However, when a defect such as a small crack occurs in the thin film encapsulation layer, external moisture and/or oxygen may penetrate into the display device, which may cause dark spot and other problems.

SUMMARY

According to an exemplary embodiment of the inventive concept, a display device includes a substrate, a display unit, and an encapsulation layer. The display unit is disposed over the substrate and includes a thin film transistor, a display element electrically connected to the thin film transistor, a protection layer, and a planarization layer. The protection layer and the planarization layer are disposed between the thin film transistor and the display element. The encapsulation layer seals the display unit. The display unit includes a display area and a non-display area outside the display area. The non-display area includes a voltage line. The planarization layer includes a dividing region dividing the planarization layer into a center portion and an outer portion. The dividing region surrounds the display area. The voltage line is partially disposed in the dividing region. The protection layer at least covers sides of the voltage line disposed in the dividing region.

The voltage line may include a first voltage line and a second voltage line to which different voltages are applied. The first voltage line includes a first main voltage line disposed to correspond to one side of the display area and a first connector protruding from the first main voltage line in a first direction and intersecting the dividing region. The second voltage line includes a second main voltage line and a second connector protruding from the second main voltage line and intersecting the dividing region. The second main voltage line partially surrounds a pair of end portions of the first main voltage line and a remaining region of the display area. The remaining region of the display area is a region of the display area that is not adjacent to the first main voltage line. The first connector and the second connector are connected to a pad.

The first connector and the second connector may be parallel to each other and are spaced apart from each other in a second direction perpendicular to the first direction. The protection layer covers two sides of the first connector and two sides of the second connector.

The protection layer may be continuously formed between the first connector and the second connector.

The protection layer may expose at least a portion of an upper surface of the first connector and at least a portion of an upper surface of the second connector, and the encapsulation layer directly contacts exposed portions of the upper surface of the first connector and the upper surface of the second connector in the dividing region.

Each of the first connector and the second connector may include a first conductive member. The first conductive member has a stack structure including a first layer including titanium, a second layer including aluminum, and a third layer including titanium.

Each of the first connector and the second connector may further include a second conductive member disposed over the first conductive member. The second conductive member has a stack structure that is substantially the same as the stack structure of the first conductive member.

The protection layer may include a first protection layer covering the sides of the first conductive member and a second protection layer covering the sides of the second conductive member.

The first protection layer and the second protection layer may contact each other outside the second conductive member.

Each of the first protection layer and the second protection layer may include an inorganic material.

The center portion may overlap and contact an inner edge of the second main voltage line.

The display device may further include a dam portion overlapping and contacting an outer edge of the second main voltage line. The dam portion is located in the dividing region.

The dam portion and the planarization layer may include substantially the same material.

The encapsulation layer may include at least one organic layer and at least one inorganic layer. The at least one organic layer is located inside the dam portion. The at least one inorganic layer extends to a region outside the outer portion.

The display element may be an organic light emitting diode and includes a first electrode electrically connected to the thin film transistor, a second electrode facing the first electrode, and an intermediate layer between the first electrode and the second electrode. The intermediate layer includes an organic emission layer.

According to an exemplary embodiment of the inventive concept, a display device includes a substrate, a buffer layer disposed over the substrate, a display unit, a first conductive member, a first protection layer formed over the first conductive member, a first planarization layer formed over the first protection layer, a second conductive member formed over the first planarization layer, a second protection layer formed over the second conductive member, and a second planarization layer formed over the second protection layer. The display unit includes a driving thin film transistor and a switching thin film transistor, which are disposed over the buffer layer. The first conductive member forms source electrodes and drain electrodes of the driving thin film transistor and the switching thin film transistor.

The display unit may further include a storage capacitor with a first electrode and a second electrode. The storage capacitor overlaps with the driving thin film transistor. The first electrode of the storage capacitor is a gate electrode of the driving thin film transistor. The second electrode overlaps with the first electrode.

The display unit may include a display area and a non-display area outside the display area. A dividing region of the display device divides each of the first planarization layer and the second planarization layer into a center portion and an outer portion. The outer portion is disposed in the non-display area. The first conductive member and the second conductive member are partially disposed in the dividing region.

The display device may further include an organic light emitting diode (OLED) disposed over the second planarization layer and an encapsulation layer formed over the OLED. The encapsulation layer seals the display unit, and in the dividing region of the display device, the encapsulation layer directly contacts an exposed portion of the second conductive member.

In the dividing region of the display device, the second conductive member may be stacked directly on top of the first conductive member. The sides of the first conductive member and the second conductive member are covered by the first protection layer and the second protection layer, respectively, leaving an upper portion of the second conductive member exposed.

BRIEF DESCRIPTION OF THE DRAWINGS

The above and other features of the inventive concept will become apparent and more clearly understood by describing in detail exemplary embodiments thereof with reference to the accompanying drawings.

DETAILED DESCRIPTION OF THE EMBODIMENTS

Figure 1:
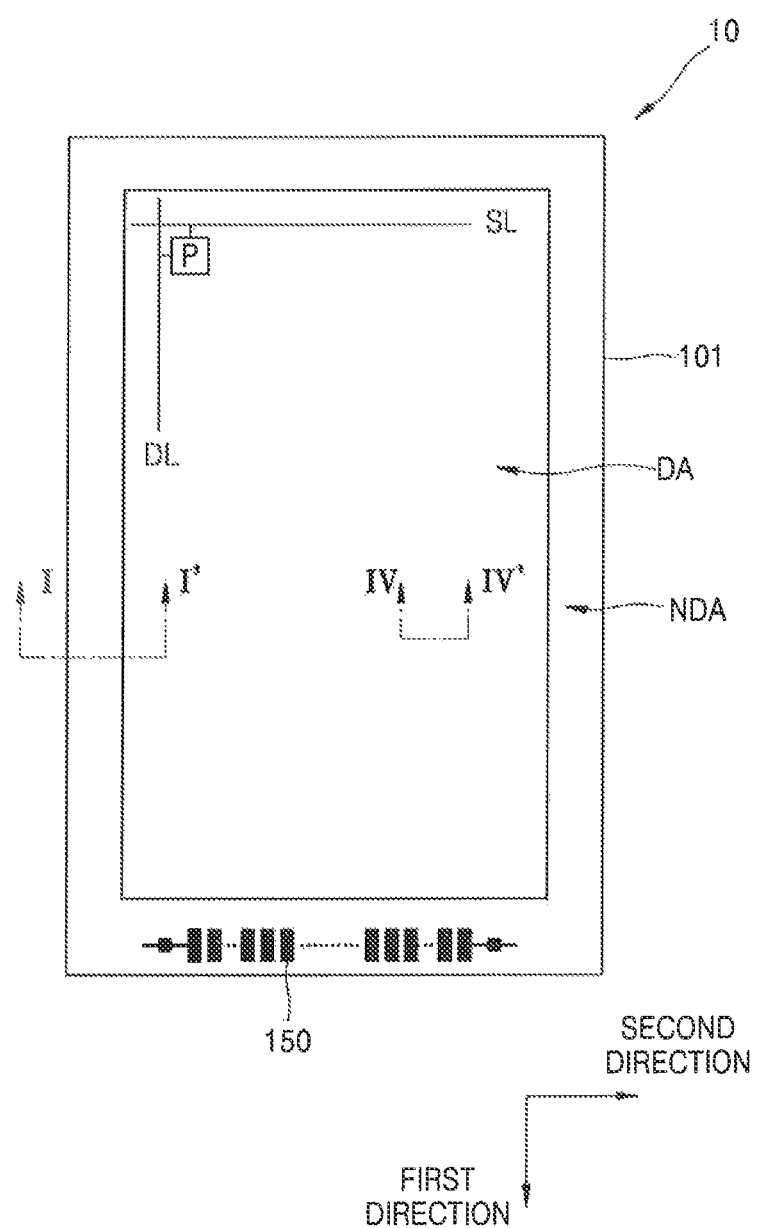
FIG. 1 is a schematic plan view of a display device according to an exemplary embodiment of the inventive concept.

Exemplary embodiments of the inventive concept will be described more fully hereinafter with reference to the accompanying drawings. Like reference numerals may refer to like elements throughout the accompanying drawings.

While such terms as "first", "second", etc., may be used to describe various components, such components must not be limited to the above terms. The above terms are used only to distinguish one component from another. For example, a first element could be termed a second element, and, similarly, a second element could be termed a first element, without departing from the scope of the present inventive concept.

The terms used in the present specification are merely used to describe particular embodiments, and are not intended to limit the present invention. An expression used in the singular encompasses the expression in the plural, unless it has a clearly different meaning in the context. In the drawings, components can be exaggerated, omitted, or schematically illustrated for convenience and clarity of explanation. In other words, sizes and thicknesses of components in the drawings do not necessarily reflect actual sizes and thicknesses thereof.

It will be understood that when a layer, region, or component is referred to as being "formed on" or "formed under" another layer, region, or component, it can be directly or indirectly formed on or under the other layer, region, or component. For example, intervening layers, regions, or components may be present.

As used herein, the term "and/or" includes any and all combinations of one or more of the associated listed items. Expressions such as "at least one of," when preceding a list of elements, modify the entire list of elements and do not modify the individual elements of the list.

Exemplary embodiments of the inventive concept relate to a display device capable of minimizing a defect that may occur in an encapsulation layer.

Figure 2:
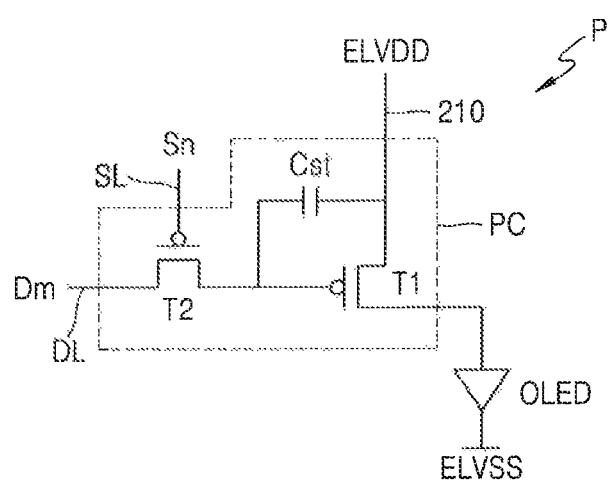
FIG. 2 is a circuit diagram of an example of an equivalent circuit of one pixel of FIG. 1 according to an exemplary embodiment of the inventive concept.
Figure 3:
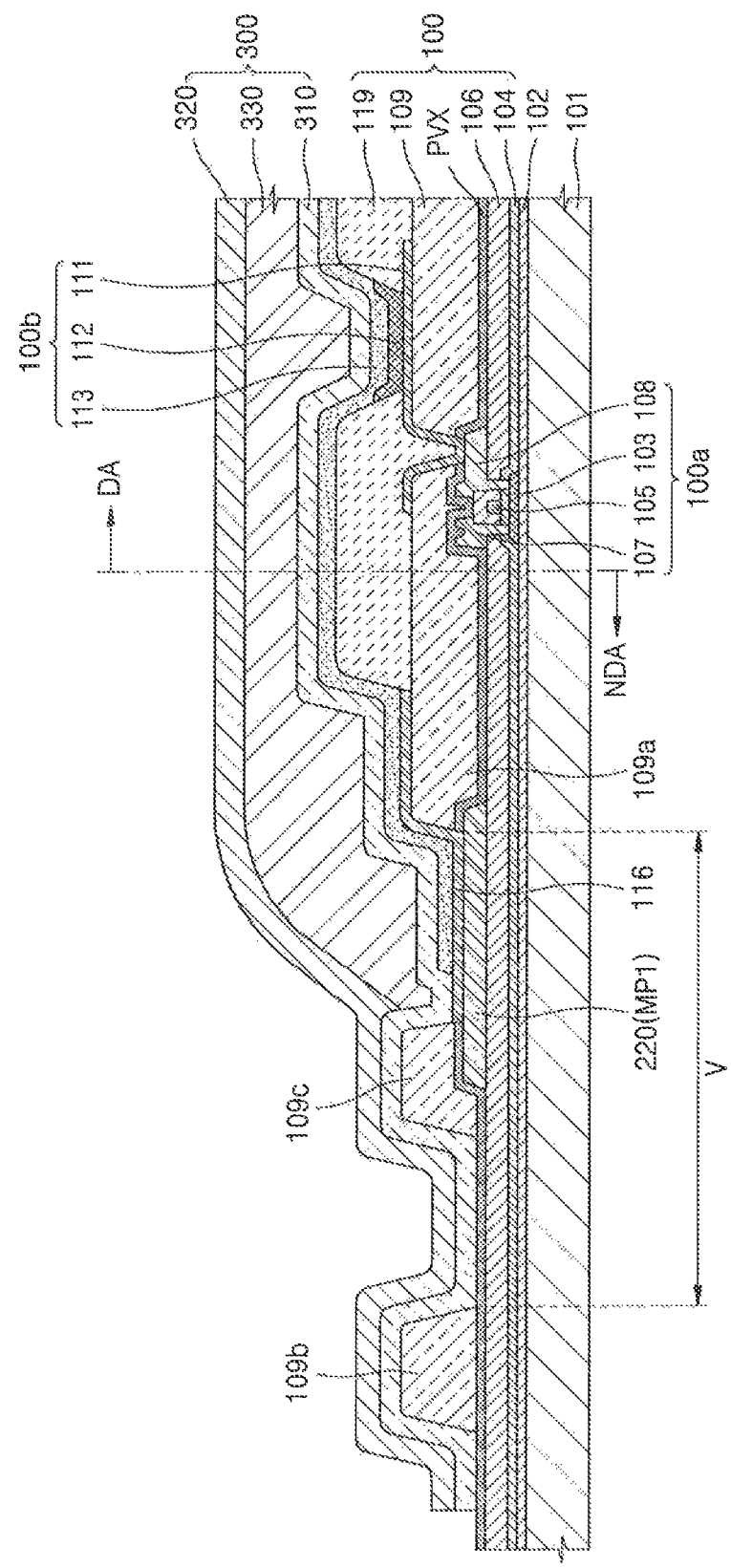
FIG. 3 is a schematic cross-sectional view of an example of the display device taken along line I-I' of FIG. 1 according to an exemplary embodiment of the inventive concept.
Figure 4:
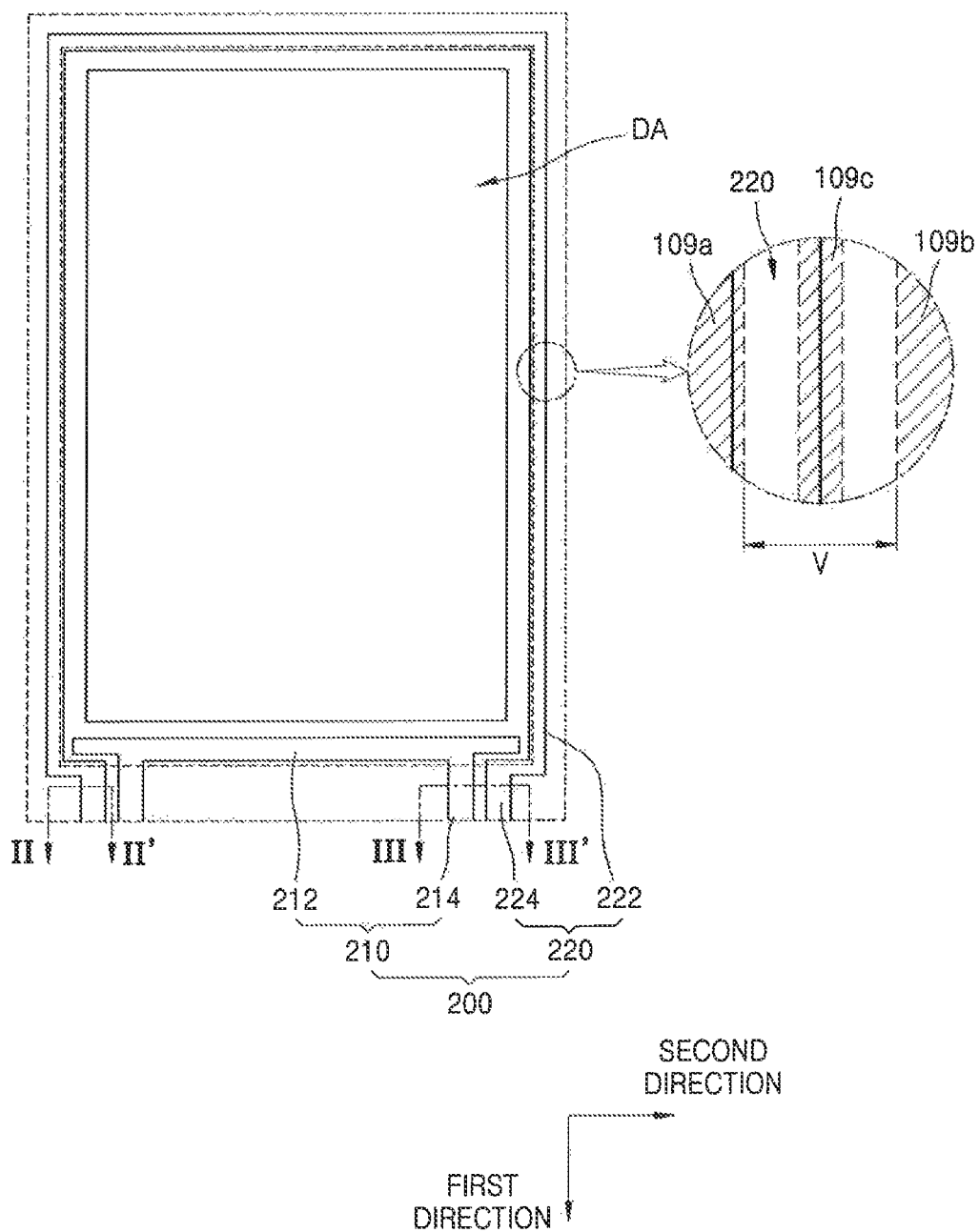
FIG. 4 is a schematic plan view of a voltage line and a planarization layer of the display device of FIG. 1 according to an exemplary embodiment of the inventive concept.
Figure 5:
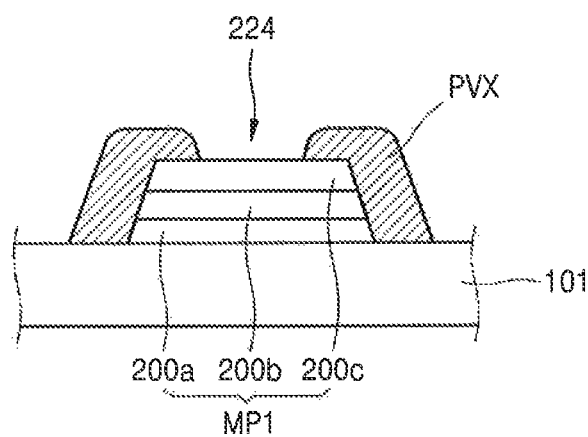
FIG. 5 is a schematic cross-sectional view of an example of the display device taken along line II-II' of FIG. 4 according to an exemplary embodiment of the inventive concept.
Figure 6:
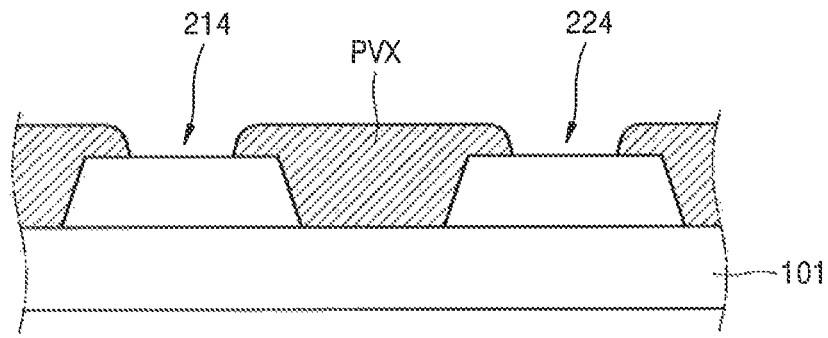
FIG. 6 is a schematic cross-sectional view of an example of the display device taken along line III-III' of FIG. 4 according to an exemplary embodiment of the inventive concept.

FIG. 1 is a schematic plan view of a display device according to an exemplary embodiment of the inventive concept. FIG. 2 is a circuit diagram of an example of an equivalent circuit of one pixel of FIG. 1. FIG. 3 is a schematic cross-sectional view of an example of the display device taken along line I-I' of FIG. 1. FIG. 4 is a schematic plan view of a voltage line and a planarization layer of the display device of FIG. 1. FIG. 5 is a schematic cross-sectional view of an example of the display device taken along line II-II' of FIG. 4. FIG. 6 is a schematic cross-sectional view of an example of the display device taken along line III-III' of FIG. 4.

Referring to FIGS. 1 through 6, according to an exemplary embodiment of the inventive concept, a flat panel display device 10 may include a substrate 101, a display unit 100 positioned over the substrate 101, and a encapsulation layer 300 sealing the display unit 100.

The substrate 101 may include various materials. The substrate 101 may include a transparent glass material having $SiO_2$ as a main component, but is not necessarily limited thereto. For example, the substrate 101 may include a transparent plastic material. The plastic material may include polyethersulphone (PES), polyacrylate (PAR), polyetherimide (PEI), polyethylene napthalate (PEN), polyethyeleneterepthalate (PET), polyphenylene sulfide (PPS), polyallylate, polyimide (PI), polycarbonate (PC), cellulose tri acetate (TAC), cellulose acetate propionate (CAP), etc.

In a bottom emission type display device, in which an image is implemented in a direction towards the substrate 101, the substrate 101 needs to include a transparent material. However, in a top emission type display device, in which an image is implemented in a direction away from the substrate 101, the substrate 101 does not need to include a transparent material. In this case, the substrate 101 may include metal. When the substrate 101 includes metal, the substrate 101 may include steel, chrome, manganese, nickel, titanium, molybdenum, stainless steel (SUS), an invar alloy, an inconel alloy, a kovar alloy, etc.

The display unit 100 may be disposed over the substrate 101. The display unit 100 may include a display area DA in which an image recognizable by a user is implemented and a non-display area NDA outside the display area DA.

A plurality of pixels P may be disposed in the display area DA. The plurality of pixels P may be positioned at an intersection of a data line DL and a scan line SL. A voltage line 200, supplying power to a display element 100b, etc. within the display area DA, may be disposed in the non-display area NDA. A pad 150, transferring an electrical signal to a power supply device or a signal generation device, may be disposed in the non-display area NDA.

Referring to FIG. 2, the pixel P may include a pixel circuit PC connected to the scan line SL and the data line DL. An organic light emitting diode OLED, which may correspond to the display element 100b of FIG. 3, may be connected to the pixel circuit PC.

The pixel circuit PC may include a driving thin film transistor T1, a switching thin film transistor T2, and a storage capacitor Cst. The switching thin film transistor T2 may be connected to the scan line SL and the data line DL, and may transfer a data signal Dm, which is input through the data line DL, to the driving thin film transistor T1, according to a scan signal Sn that is input through the scan line SL.

The storage capacitor Cst may be connected to the switching thin film transistor T2 and a first voltage line 210, and may store a voltage corresponding to a difference between a voltage received from the switching thin film transistor T2 and a first power voltage EVLDD supplied to the first voltage line 210.

The driving thin film transistor T1 may be connected to the first voltage line 210 and the storage capacitor Cst, and may control a driving current flowing from the first voltage line 210 to the organic light emitting diode OLED in correspondence to a value of the voltage stored in the storage capacitor Cst. However, the inventive concept is not limited thereto. In other words, the pixel P may be driven by various configurations.

A structure of the display unit 100 will be described in more detail below with reference to FIG. 3. For convenience of description, the switching thin film T2 and the storage capacitor Cst of the pixel circuit PC of FIG. 2 are omitted and only the driving thin film transistor T1 is illustrated in FIG. 3. The driving thin film transistor T1 is referred to as a thin film transistor 100a.

A buffer layer 102 may be formed over the substrate 101. The buffer layer 102 may provide a flat upper surface to the substrate 101 and may block impurities or moisture from penetrating into the substrate 101. For example, the buffer layer 102 may contain an inorganic material such as silicon oxide, silicon nitride, silicon oxynitride, aluminum oxide, aluminum nitride, titanium oxide, titanium nitride, etc., or an organic material such as polyimide, polyester, acryl, etc. The buffer layer 102 may have a stack structure of these materials.

The thin film transistor 100a and the display element 100b, which is electrically connected to the thin film transistor 100a, may be positioned over the substrate 101.

The thin film transistor 100a may include an active layer 103, a gate electrode 105, a source electrode 107, and a drain electrode 108. The thin film transistor 100a may be a top gate type in which the active layer 103, the gate electrode 105, the source electrode 107, and the drain electrode 108 are sequentially formed. However, the inventive concept is not limited thereto. Various types of thin film transistors, such as a bottom gate type thin film transistor, may be employed as the thin film transistor 100a.

The active layer 103 may include a semiconductor material, for example, amorphous silicon or polycrystalline silicon. However, the inventive concept is not limited thereto. The active layer 103 may include various materials. According to an exemplary embodiment of the inventive concept, the active layer 103 may include an organic semiconductor material or the like. According to an exemplary embodiment of the inventive concept, the active layer 103 may include an oxide semiconductor material. For example, the active layer 103 may include an oxide of a material selected from Group 12, 13, and 14 metal elements such as zinc (Zn), indium (In), gallium (Ga), stannum (Sn), cadmium (Cd), germanium (Ge)), or a combination thereof.

A gate insulating layer 104 may be formed over the active layer 103. The gate insulating layer 104 may have a multi-layer structure or a single layer structure and the layer(s) may include an inorganic material such as silicon oxide and/or silicon nitride, etc. The gate insulating layer 104 may function to insulate the active layer 103 and the gate electrode 105. The gate insulating layer 104 may extend to not only the display area DA but also a part of the non-display area NDA.

The gate electrode 105 may be formed above the gate insulating layer 104. The gate electrode 105 may be connected to a gate line that applies an ON/OFF signal to the thin film transistor 100a.

The gate electrode 105 may include a low resistance metal material. For example, the gate electrode 105 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu) in a single layer structure or a multilayer structure.

An interlayer insulating layer 106 may be formed over the gate electrode 105. The interlayer insulating layer 106 may insulate the source electrode 107, the drain electrode 108, and the gate electrode 105. The interlayer insulating layer 106 may extend to not only the display area DA but also a part of the non-display area NDA.

The interlayer insulating layer 106 may have a multilayer structure or a single layer structure with layer(s) that include an inorganic material. For example, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

A first conductive member MP1, which may correspond to a second voltage line 220, may be formed over the interlayer insulating layer 106. The first conductive member MP1 may form the source electrode 107 and the drain electrode 108. The source electrode 107 and the drain electrode 108 may contact an area of the active layer 103.

Each of the source electrode 107 and the drain electrode 108 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), or copper (Cu) in a single layer structure or a multilayer structure. For example, the source electrode 107 and the drain electrode 108 may have a triple layer stack structure of titanium (Ti), aluminum (Al), and titanium (Ti).

A protection layer PVX and a planarization layer 109 may be formed over the thin film transistor 100a. The protection layer PVX may protect the thin film transistor 100a from impurities during a manufacturing process and may include an inorganic material, e.g., at least one of silicon oxide, silicon nitride, silicon oxynitride, etc.

The thin film transistor 100a may create steps that result in an uneven surface. The planarization layer 109 may resolve the steps caused by the thin film transistor 100a by planarizing an upper surface, thereby preventing a defect from occurring in the display element 100b due to lower unevenness. The planarization layer 109 may have a single layer structure or a multilayer structure with layer(s) that include an organic material. The organic material may include a commercial polymer such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 109 may be a composite stack of inorganic insulating layers and organic insulating layers.

The planarization layer 109 may include a dividing region V that is in the non-display area NDA and surrounds the display area DA. The dividing region V may be an area from which the planarization layer 109 is removed and may prevent external moisture, along the planarization layer 109, from penetrating into the display area DA. The planarization layer 109 may split into a center portion 109a and an outer portion 109b due to the dividing region V. An area of the center portion 109a may be greater than an area of the display area DA.

The display element 100b may be disposed over the planarization layer 109. The display element 100b may be, for example, the organic light emitting diode OLED including a first electrode 111, a second electrode 113 facing the first electrode 111, and an intermediate layer 112 interposed between the first electrode 111 and the second electrode 113.

The first electrode 111 may be formed over the planarization layer 109 and may be electrically connected to the thin film transistor 100a. The first electrode 111 may have various shapes. For example, the first electrode 111 may be patterned to have an island shape.

The first electrode 111 may be, for example, a reflective electrode. For example, the first electrode 111 may include a reflective layer, such as silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed over the reflective layer. The transparent or semi-transparent electrode layer may include one or more materials selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode 113 may be, for example, a transparent or semi-transparent electrode. The second electrode 113 may include a metal thin film having a small work function, and the metal may include Li, Ca, LiF/Ca, LiF/Al, Al, Ag, Mg, or a combination thereof. An auxiliary electrode layer or a bus electrode may include a material such as ITO, IZO, ZnO, or $In_2O_3$, etc., and may be further formed over the metal thin film. Accordingly, the second electrode 113 may transmit light emitted from an organic emission layer included in the intermediate layer 112. In other words, the light emitted by the organic emission layer may be reflected directly or by the first electrode 111 formed as the reflective electrode, and then discharged toward the second electrode 113.

The display 200 of the present exemplary embodiment is not limited to a top-emission type. The display 200 may be a bottom-emission type in which the light emitted by the organic emission layer is emitted towards the substrate 101. In this case, the first electrode 111 may be a transparent or semi-transparent electrode, and the second electrode 113 may be a reflective electrode. Alternatively, the display 200 may be of a dual emission type that emits light in both directions, e.g., from the top and bottom surfaces of the display 200.

A pixel defining layer 119 may include an insulating material, and may be formed over the first electrode 111. The pixel defining layer 119 may include one or more organic insulating materials, selected from the group consisting of polyimide, polyamide (PA), acryl resin, benzocyclobutene (BCB), and phenolic resin, by using a method such as spin coating. The pixel defining layer 119 may expose a predetermined area of the first electrode 111. The intermediate layer 112 including the organic emission layer may be positioned in the exposed area of the first electrode 111. In other words, the pixel defining layer 119 may define a pixel area of the organic light-emitting device OLED.

The organic emission layer included in the intermediate layer 112 may include a low molecular organic material or a high molecular organic material. The intermediate layer 112 may selectively include functional layers, such as a hole transport layer (HTL), a hole injection layer (HIL), an electron transport layer (ETL), an electron injection layer (EIL), etc., in addition to the organic emission layer.

A voltage line 200 and the dividing region V may be disposed in the non-display area NDA. The voltage line 200 may be at least partially disposed in the dividing region V. In other words, the voltage line 200 may be partially exposed in the dividing region V.

The voltage line 200 may include a first voltage line 210 and a second voltage line 220. For example, the first voltage line 210 may be a first power voltage ELVDD, and the second voltage line 220 may be a second power voltage ELVSS. The second voltage line 220 may be connected to the second electrode 113. FIG. 2 illustrates an example in which the second voltage line 220 and the second electrode 113 are connected to each other via a wiring 116, but the inventive concept is not limited thereto. For example, the second voltage line 220 and the second electrode 113 may be directly connected to each other.

The first voltage line 210 may include a first main voltage line 212 and a first connector 214 that are disposed to correspond to one side of the display area DA. For example, when the display area DA is a rectangular shape, the first main voltage line 212 may be disposed to correspond to one side of the display area DA. In other words, a portion of the first main voltage line 212 may be parallel to one side of the display area DA and may have a length greater than the length of the one side of the display area DA. The one side of the display area DA corresponding to the first main voltage line 212 may be the side that is adjacent to the pad 150.

The first connector 214 may protrude from the first main voltage line 212 in a first direction to intersect with the dividing region V. In this regard, the first direction may be a direction towards the pad 150 from the display area DA. The first connector 214 may be connected to the pad 150.

The first main voltage line 212 may be covered by the center portion 109a. The first connector 214 may be exposed in the dividing region V.

The second voltage line 220 may include a second main voltage line 222 and a second connector 224. The second main voltage line 222 may surround both ends of the first main voltage line 212 and a remaining region of the display area DA (excluding the one side of the display area DA corresponding to the first main voltage line 212). The second connector 224 may protrude from the second main voltage line 222 in the first direction to intersect with the dividing region V. The second connector 224 may be connected to the pad 150 and may be exposed in the dividing region V.

The voltage line 200 may include the first conductive member MP1. The first conductive member MP1 may include the same material as the source electrode 107 and the drain electrode 108. For example, the voltage line 200 may have a stack structure of a first layer 200a including titanium (Ti), a second layer 200b including aluminum (Al), and a third layer 200c including titanium (Ti). In this regard, since aluminum (Al) has a higher etch rate than titanium (Ti), when the sides of the voltage line 200 are exposed in the dividing region V during a processing procedure (e.g., a procedure of patterning the first electrode 111), excessive etching of the second layer 200b may occur, a defect may occur in the third layer 200c, and step coverage of the voltage line 200 may deteriorate. As such, damage may result, such as a crack in the encapsulation layer 300 that contacts the voltage line 200 in the dividing region V. To prevent this, the sides of the voltage line 200 exposed in the dividing region V may be covered by the protection layer PVX. When the protection layer PVX is not formed over the thin film transistor 100a, the protection layer PVX may be formed to cover the exposed sides of the voltage line 200.

For example, as shown in FIG. 5, both sides of the second connector 224 that may be exposed by the dividing region V may be covered by the protection layer PVX, preventing the second layer 200b, which includes aluminum, from being exposed to an etching environment. Thus, the step coverage of the second connector 224 may be enhanced, preventing the encapsulation layer 300, which contacts the second connector 224, from being damaged. Similarly, both sides of the first connector 214 may be covered by the protection layer PVX.

The protection layer PVX may expose an upper surface of the first connector 214 and an upper surface of the second connector 224. The upper surface of the first connector 214 and the upper surface of the second connector 224 that are exposed in the dividing region V may directly contact the encapsulation layer 300. As shown in FIG. 6, the first connector 214 and the second connector 224 may be parallel to each other and may be spaced apart from each other in a second direction perpendicular to the first direction. In this regard, the protection layer PVX may be continuously disposed between the first connector 214 and the second connector 224.

Referring to FIG. 3, a dam portion 109c may be formed in the dividing region V. The encapsulation layer 300 may include an organic layer 300 for sealing the display unit 100. The dam portion 109c may block an organic material from flowing in an edge direction of the substrate 101 when the organic layer 330 is formed and may prevent an edge tail of the organic layer 300 from being formed.

The dam portion 109c may contact and overlap an outer edge of the second main voltage line 222, so that an outer surface of the second main voltage line 222 may be covered. The center portion 109a may contact and overlap an inner edge of the second main voltage line 222, so that an inner surface of the second main voltage line 222 may be covered. Thus, this arrangement may prevent both sides of the second main voltage line 222 from being exposed in the etching environment. The protection layer PVX may also be formed to cover both sides of the second main voltage line 222, to better prevent both sides of the second main voltage line 222 from being exposed in the etching environment.

The dam portion 109c may be formed on the same layer as and may include the same material as the planarization layer 109. However, the inventive concept is not limited thereto. The dam portion 109c may include two or more layers. For example, when the dam portion 109c has a double layer structure, a lower layer may include the same material as the planarization layer 109 and an upper layer may include the same material as the pixel defining layer 119. Two or more dam portions 109c may be formed. When a plurality of dam portions 109c is formed, the height of the plurality of dam portions 109c may increase the closer it is to the outside of the substrate 101.

The encapsulation layer 300 may seal the display unit 100 to prevent external oxygen, moisture, etc. from penetrating into the display unit 100. The encapsulation layer 300 may include inorganic layers 310 and 320 and the organic layer 330. Each of the inorganic layer 310, the inorganic layer 320, and the organic layer 330 may include a plurality of layers. FIG. 3 illustrates an example in which the encapsulation layer 300 include the two inorganic layers 310 and 320 that are alternately stacked with the organic layer 330 disposed in between. However, the inventive concept is not limited thereto. For example, the encapsulation layer 300 may further include a plurality of inorganic layers and organic layers that are alternately disposed. The stack number of inorganic layers and organic layers in the encapsulation layer 300 may vary.

The organic layer 330 may include one or more materials selected from the group consisting of, for example, acryl-based resin, methacryl-based resin, polyisoprene, vinyl-based resin, epoxy-based resin, urethane-based resin, cellulose-based resin, and perylene-based resin.

The inorganic layers 310 and 320 may include one or more materials selected from the group consisting of, for example, silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

As described above, the dam portion 109c may block the organic material from flowing in the edge direction of the substrate 101 when the organic layer 330 is formed. As such, the organic layer 330 may be positioned inside the dam portion 109c. On the other hand, the inorganic layers 310 and 320 may be larger than the organic layer 330 such that the inorganic layers 310 and 320 may cover the outer portion 109b. As described above, the sides of the voltage line 200 exposed in the dividing region V may be covered by the protection layer PVX, and thus step coverage may be improved. Therefore, defects may be prevented from occurring in the inorganic layers 310 and 320 formed in an upper portion, which prevents external moisture or oxygen from penetrating into the display device 10 and thus minimizes the occurrence of defects such as dark spots.

The inorganic layers 310 and 320 may extend to an outside of the outer portion 109b, and may contact each other on the outside of the outer portion 109b. At least one of the inorganic layers 310 and 320 may contact the protection layer PVX on the outside of the outer portion 109b, thereby preventing penetration of external moisture through the sides and enhancing the sealing characteristics of the encapsulation layer 300.

Figure 7:
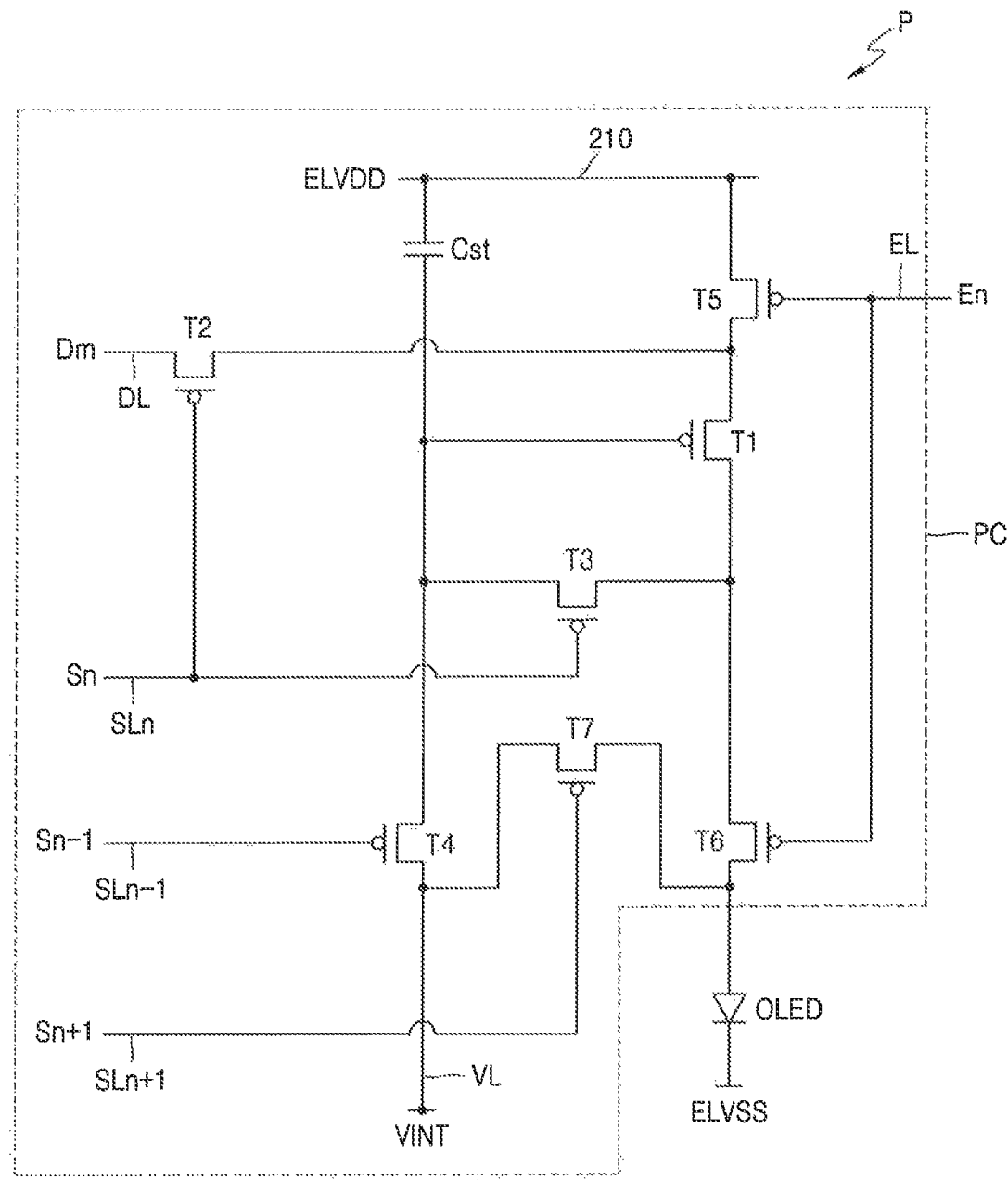
FIG. 7 is a circuit diagram of an example of an equivalent circuit of one pixel of FIG. 1 according to an exemplary embodiment of the inventive concept.
Figure 8:
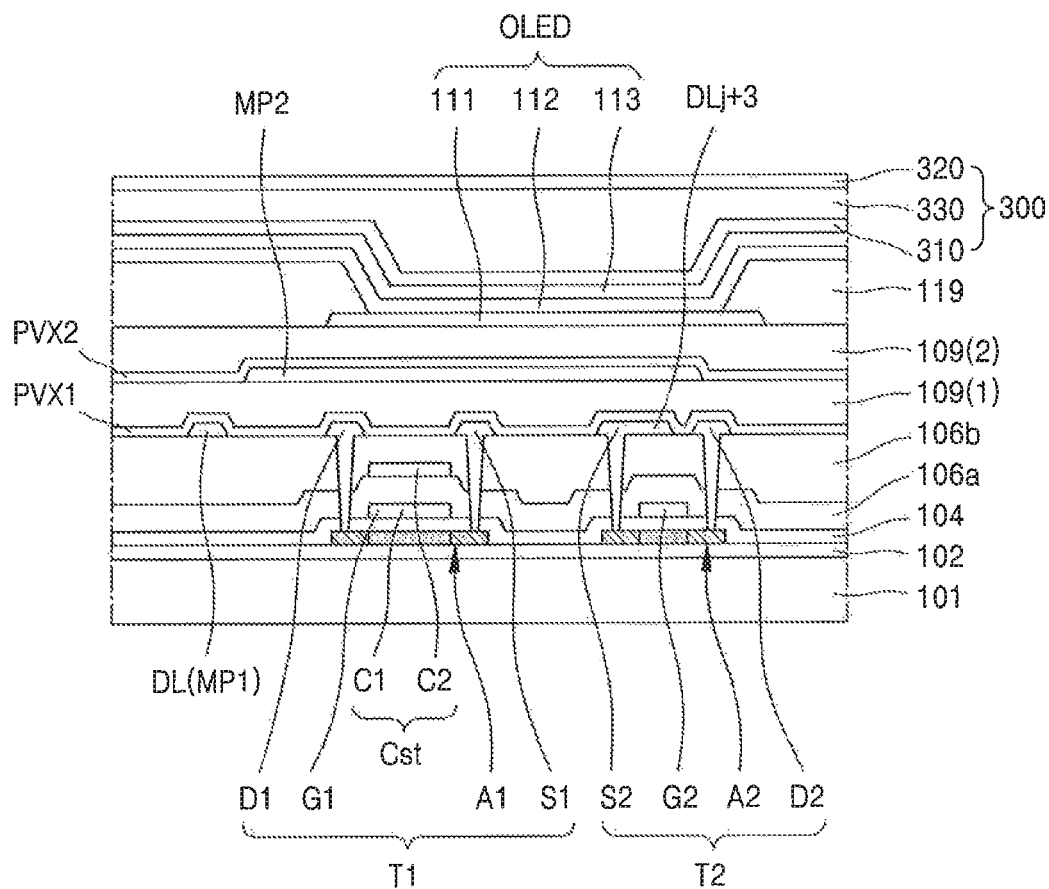
FIG. 8 is a schematic cross-sectional view of an example of the display device taken along line IV-IV' of FIG. 1 according to an exemplary embodiment of the inventive concept.
Figure 9:
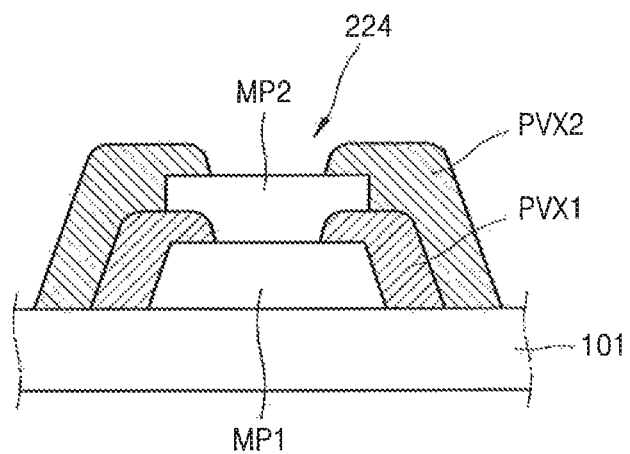
FIG. 9 is a schematic cross-sectional view of an example of the display device taken along line II-II' of FIG. 4 according to an exemplary embodiment of the inventive concept.

FIG. 7 is a circuit diagram of an example of an equivalent circuit of a pixel P of FIG. 1 according to an exemplary embodiment of the inventive concept. FIG. 8 is a schematic cross-sectional view of an example of the display device taken along line IV-IV' of FIG. 1 according to an exemplary embodiment of the inventive concept. FIG. 9 is a schematic cross-sectional view of an example of the display device taken along line II-II' of FIG. 4 according to an exemplary embodiment of the inventive concept.

Referring to FIG. 7, the pixel P may include the pixel circuit PC and a display element. The pixel circuit PC may include, for example, a plurality of thin film transistors T1 through T7 and at least one storage capacitor Cst. The pixel circuit PC may be electrically connected to the display element. The display element may receive driving current through the pixel circuit PC to emit light. The display element may be, for example, an organic light emitting diode OLED. FIG. 7 merely illustrates an example of a circuit driving the pixel P. In other words, the organic light emitting diode OLED may be driven by various other circuit configurations.

The plurality of thin film transistors T1 through T7 may include the driving thin film transistor T1, the switching thin film transistor T2, a compensation thin film transistor T3, a first initialization thin film transistor T4, a first emission control thin film transistor T5, a second emission control thin film transistor T6, and a second initialization thin film transistor T7.

The pixel circuit PC may include a first scan line SLn transferring a first scan signal Sn to the switching thin film transistor T2 and the compensation thin film transistor T3, a second scan line SLn−1 transferring a second scan signal Sn−1 to the first initialization thin film transistor T4, a third scan line SLn+1 transferring a third scan signal Sn+1 to the second initialization thin film transistor T7, an emission control line EL transferring an emission control signal En to the first emission control thin film transistor T5 and the second emission control thin film transistor T6, the data line DL transferring the data signal Dm, the first voltage line 210 transferring the first power voltage ELVDD, and an initialization voltage line VL transferring an initialization voltage VINT initializing the driving thin film transistor T1.

A drain electrode of the driving thin film transistor T1 may be electrically connected to the organic light emitting diode OLED via the second emission control thin film transistor. The driving thin film transistor T1 may receive the data signal Dm according to a switching operation of the switching thin film transistor T2 and may supply driving current to the organic light emitting diode OLED.

A gate electrode of the switching thin film transistor T2 may be connected to the first scan line SLn. A source electrode of the switching thin film transistor T2 may be connected to the data line DL. A drain electrode of the switching thin film transistor T2 may be connected to a source electrode of the driving thin film transistor T1 and may be connected to the first voltage line 210 via the first emission control thin film transistor T5.

The switching thin film transistor T2 may be turned on according to the first scan signal Sn received through the first scan line SLn to perform the switching operation of transferring the data signal Dm received from the data line DL to the source electrode of the driving thin film transistor T1.

A gate electrode of the compensation thin film transistor T3 may be connected to the first scan line SLn. A source electrode of the compensation thin film transistor T3 may be connected to the drain electrode of the driving thin film transistor T1 and may be connected to a first electrode 111 of the organic light emitting diode OLED (as shown in FIG. 8) via the second emission control thin film transistor T6. A drain electrode of the compensation thin film transistor T3 may be connected to a first electrode C1 of the storage capacitor Cst (as shown in FIG. 8), a source electrode of the first initialization thin film transistor T4, and a gate electrode of the driving thin film transistor T1. The compensation thin film transistor T3 may be turned on according to the first scan signal Sn received through the first scan line SLn to connect the gate electrode and the drain electrode of the driving thin film transistor T1 and diode-connect the driving thin film transistor T1.

A gate electrode of the first initialization thin film transistor T4 may be connected to the second scan line SLn−1. A drain electrode of the first initialization thin film transistor T4 may be connected to the initialization voltage line VL. A source electrode of the first initialization thin film transistor T4 may be connected to the first electrode C1 of the storage capacitor Cst (as shown in FIG. 8), the drain electrode of the compensation thin film transistor T3, and the gate electrode of the driving thin film transistor T1. The first initialization thin film transistor T4 may be turned on according to the second scan signal Sn−1 received through the second scan line SLn−1 to transfer the initialization voltage VINT from the initialization voltage line VL to the gate electrode of the driving thin film transistor T1 and perform an initialization operation of initializing a voltage of the gate electrode of the driving thin film transistor T1.

A gate electrode of the first emission control thin film transistor T5 may be connected to the emission control line EL. A source electrode of the first emission control thin film transistor T5 may be connected to the first voltage line 210. A drain electrode of the first emission control thin film transistor T5 may be connected to the source electrode of the driving thin film transistor T1 and the drain electrode of the switching thin film transistor T2.

A gate electrode of the second emission control thin film transistor T6 may be connected to the emission control line EL. A source electrode of the second emission control thin film transistor T6 may be connected to the drain electrode of the driving thin film transistor T1 and the source electrode of the compensation thin film transistor T3.

A drain electrode of the second emission control thin film transistor T6 may be connected to the first electrode 111 of the organic light emitting diode OLED (as shown in FIG. 8). The first emission control thin film transistor T5 and the second emission control thin film transistor T6 may be simultaneously turned on according to the emission control signal En received through the emission control line EL so that the first power voltage ELVDD may be transferred to the organic light emitting diode OLED and the driving current may flow into the organic light emitting diode OLED.

A gate electrode of the second initialization thin film transistor T7 may be connected to the third scan line SLn+1. A source electrode of the second initialization thin film transistor T7 may be connected to the first electrode 111 of the organic light emitting diode OLED (as shown in FIG. 8). A drain electrode of the second initialization thin film transistor T7 may be connected to the initialization voltage line VL. The second initialization thin film transistor T7 may be turned on according to the third scan signal Sn+1 received through the third scan line SLn+1 to initialize the first electrode 111 of the organic light emitting diode OLED (as shown in FIG. 8).

A second electrode C2 of the storage capacitor Cst (as shown in FIG. 8) may be connected to the first voltage line 210. The first electrode C1 of the storage capacitor Cst (as shown in FIG. 8) may be connected to the gate electrode of the driving thin film transistor T1, the drain electrode of the compensation thin film transistor T3, and the source electrode of the first initialization thin film transistor T4.

A second electrode 113 of the organic light emitting diode OLED (as shown in FIG. 8) may be connected to the second power voltage ELVSS. The organic light emitting diode OLED may receive the driving current from the driving thin film transistor T1 to emit light.

Regarding FIG. 8, for convenience of description, FIG. 8 illustrates only a first thin film transistor T1, a second thin film transistor T2, and the storage capacitor Cst in the pixel circuit PC.

Referring to FIG. 8, the buffer layer 102 may be positioned over the substrate 101. The first thin film transistor T1 and the second thin film transistor T2 may be positioned over the buffer layer 102.

The first thin film transistor T1 may be a driving thin film transistor and may include an active layer A1, a gate electrode G1, a source electrode S1, and a drain electrode D1. The second thin film transistor T2 may be a switching thin film transistor and may include an active layer A2, a gate electrode G2, a source electrode S2, and a drain electrode D2. FIG. 8 illustrates an example of a top gate type in which the gate electrodes G1 and G2 of the first thin film transistor T1 and the second thin film transistor T2 are disposed over the active layers A1 and A2, respectively, with the gate insulating layer 104 therebetween. However, the inventive concept is not limited thereto. For example, the first thin film transistor T1 and the second thin film transistor T2 may be bottom gate types.

The active layers A1 and A2 of the first thin film transistor T1 and the second thin film transistor T2 may include amorphous silicon or polycrystalline silicon. According to an exemplary embodiment of the inventive concept, the active layers A1 and A2 may include an oxide of one or more materials selected from the group consisting of indium (In), gallium (Ga), stannum (Sn), vanadium (V), hafnium (Hf), cadmium (Cd), germanium (Ge), chrome (Cr), titanium (Ti), and zinc (Zn). The active layers A1 and A2 may include a source area and a drain area that are doped with impurities and a channel area.

The gate insulating layer 104 may be positioned over the active layers A1 and A2. The gate electrodes G1 and G2 of the first thin film transistor T1 and the second thin film transistor T2 may be positioned over the gate insulating layer 104. The gate electrode G1 of the first thin film transistor T1 may constitute the first electrode C1 of the storage capacitor Cst.

The first interlayer insulating layer 106a disposed over the gate electrodes G1 and G2 may include an inorganic material including an oxide or a nitride. The second electrode C2 of the storage capacitor C2 may be positioned over the first interlayer insulating layer 106a to overlap with the first electrode C1. As described above, the first electrode C1 may be the same electrode as the gate electrode G1 of the first thin film transistor T1, and thus the storage capacitor Cst may overlap with the first thin film transistor T1.

The second interlayer insulating layer 106b may be positioned over the second electrode G2. The first conductive member MP1 may be disposed over the second interlayer insulating layer 106b. The first conductive member MP1 may form the source electrodes S1 and S2 and the drain electrodes D1 and D2 of the first thin film transistor T1 and the second thin film transistor T2 as well as the data line DL. The first conductive member MP1 may have a stack structure of a first layer including titanium, a second layer including aluminum, and a third layer including titanium.

A first protection layer PVX1 and a first planarization layer 109(1) may be formed over the first conductive member MP1. The first protection layer PVX1 and the first planarization layer 109(1) may be substantially the same as the protection layer PVX and the planarization layer 109, respectively, as described with reference to FIG. 3. A second conductive member MP2 may be formed over the first planarization layer 109(1). The second conductive member MP2 may have a stack structure of a first layer including titanium, a second layer including aluminum, and a third layer including titanium, similar to the first conductive member MP1.

The second conductive member MP2 may be disposed at least between the gate electrode G1 of the first thin film transistor T1 and the first electrode 111 to reduce parasitic capacitance generated between the gate electrode G1 and the first electrode 111.

A second protection layer PVX2 and a second planarization layer 109(2) may be formed over the second conductive member MP2. The second protection layer PVX2 and the second planarization layer 109(2) may be substantially the same as the protection layer PVX and the planarization layer 109, respectively, as described with reference to FIG. 3.

The organic light emitting diode OLED may be positioned over the second planarization layer 109(2). The organic light emitting diode OLED may include the first electrode 111, the second electrode 113, and the intermediate layer 112 disposed between the first electrode 111 and the second electrode 113.

The dividing region V of FIG. 3 may divide the first planarization layer 109(1) and the second planarization layer 109(2) into the center portion 109a of FIG. 3 and the outer portion 109b of FIG. 3, respectively. In this regard, at least the second protection layer PVX2 may divided along with the first planarization layer 109(1) and the second planarization layer 109(2) by the dividing region V.

The first electrode 111 may be electrically connected to the drain electrode D1 of the first thin film transistor T1 via the second emission control thin film transistor T6 of FIG. 7. The second electrode 113 may be electrically connected to the second voltage line 220 of FIG. 4.

The voltage line 200 of FIG. 4 may have a stack structure of the first conductive member MP1 and the second conductive member MP2, thereby reducing resistance of the voltage line 200 of FIG. 4. The sides of the first connector 214 and the second connector 224 of FIG. 4 that are exposed in the dividing region V may be covered by the first protection layer PVX1 and the second protection layer PVX2, preventing the sides of the first conductive member MP1 and the second conductive member MP2 from being exposed to an etching environment. When the first protection layer PVX1 and the second protection layer PVX2 are not formed over the first conductive member MP1, and only the first planarization layer 109(1) and the second planarization layer 109(2) are formed, the first protection layer PVX1 and the second protection layer PVX2 may be formed only in a position that covers the sides of the conductive member MP1 and the second conductive member MP2.

For example, both sides of the first conductive member MP1 included in the first connector 214 and the second connector 224 of FIG. 4 may be covered by the first protection layer PVX1, and both sides of the second conductive member MP2 included in the first connector 214 and the second connector 224 of FIG. 4 may be covered by the second protection layer PVX2. In this regard, the first protection layer PVX1 may expose an upper surface of the first conductive member MP1, and the second conductive member MP2 may contact the first conductive member MP1 through the exposed upper surface. The second protection layer PVX2 may be formed to expose an upper surface of the second conductive member MP2. The first protection layer PVX1 and the second protection layer PVX2 may contact each other on the outside of the second conductive member MP2. As shown in FIG. 6, the first protection layer PVX1 and the second protection layer PVX2 may be continuously formed between the first connector 214 and the second connector 224 of FIG. 4.

The encapsulation layer 300 formed over the second electrode 113 may include the inorganic layers 310 and 320 and the organic layer 330, as described above, and may directly contact the first connector 214 and the second connector 224 in the dividing region V of FIG. 4. In this regard, as described above, the sides of the first connector 214 and the second connector 224 of FIG. 4 may be covered by the first protection layer PVX1 and the second protection layer PVX2, and thus step coverage of the first connector 214 and the second connector 224 of FIG. 4 may be improved, thereby preventing defects from occurring in the inorganic layers 310 and 320 formed in an upper portion. Thus, penetration of external moisture or oxygen into the display device may be prevented, thereby minimizing occurrence of a defect such as a dark spot, etc.

As described above, according to exemplary embodiments of the inventive concept, a display device may minimize a defect that may occur in an encapsulation layer, thereby minimizing occurrence of defects such as dark spots, etc. While the inventive concept has been shown and described with reference to exemplary embodiments thereof, it will be understood by those of ordinary skill in the art that various changes in form and details may be made thereto without departing from the spirit and scope of the present inventive concept as defined by the following claims.

What is claimed is:

1. A display device comprising:
a substrate;
a display unit disposed over the substrate and comprising a display area and a non-display area outside the display area; and
an encapsulation layer over the display unit,
wherein the display unit comprises a thin film transistor, a display element, a protection layer, and a planarization layer in the display area, wherein the display element is electrically connected to the thin film transistor, and the protection layer and the planarization layer are disposed between the thin film transistor and the display element and extend to the non-display area,
the non-display area comprises a voltage line,
the planarization layer comprises a dividing region around the display area, wherein the dividing region divides the planarization layer into a center portion and an outer portion, the voltage line is partially disposed in the dividing region,
the protection layer at least covers the sides of the voltage line disposed in the dividing region,
the voltage line comprises a first voltage line and a second voltage line to which different voltages are applied,
the first voltage line comprises a first main voltage line disposed to correspond to one side of the display area and a first connector protruding from the first main voltage line in a first direction, and intersecting the dividing region,
the second voltage line comprises a second main voltage line and a second connector protruding from the second main voltage line in the first direction and intersecting the dividing region, wherein the first connector and the second connector are parallel to each other and are spaced apart from each other in a second direction perpendicular to the first direction,
the protection layer covers two sides of the first connector and two sides of the second connector,
the display device further comprises a dam portion within the dividing region, and
the dam portion and the outer portion are formed so as to be distinguished from each other, and a spacing area is formed therebetween.

2. The display device of claim 1, wherein
the second main voltage line partially surrounds a pair of end portions of the first main voltage line and a remaining region of the display area,
the remaining region of the display area is a region of the display area that is not adjacent to the first main voltage line, and
the first connector and the second connector are connected to a pad.

3. The display device of claim 1, wherein the protection layer is continuously formed between the first connector and the second connector.

4. The display device of claim 1, wherein the protection layer exposes at least a portion of an upper surface of the first connector and at least a portion of an upper surface of the second connector, and the encapsulation layer directly contacts exposed portions of the upper surface of the first connector and the upper surface of the second connector in the dividing region.

5. The display device of claim 1, wherein each of the first connector and the second connector comprises a first conductive member, and
the first conductive member has a stack structure including a first layer comprising titanium, a second layer comprising aluminum, and a third layer comprising titanium.

6. The display device of claim 5, wherein each of the first connector and the second connector further comprises a second conductive member disposed over the first conductive member, and
the second conductive member has a stack structure that is substantially the same as the stack structure of the first conductive member.

7. The display device of claim 6, wherein the protection layer comprises a first protection layer covering the sides of the first conductive member and a second protection layer covering the sides of the second conductive member.

8. The display device of claim 7, wherein the first protection layer and the second protection layer contact each other outside the second conductive member.

9. The display device of claim 7, wherein each of the first protection layer and the second protection layer comprises an inorganic material.

10. The display device of claim 1, wherein the center portion overlaps and contacts an inner edge of the second main voltage line.

11. The display device of claim 10, wherein the dam portion overlaps and contacts an outer edge of the second main voltage line.

12. The display device of claim 11, wherein the dam portion and the planarization layer comprise substantially the same material.

13. The display device of claim 11, wherein the encapsulation layer comprises at least one organic layer and at least one inorganic layer, the at least one organic layer is located inside the dam portion, and the at least one inorganic layer extends to a region outside the outer portion.

14. The display device of claim 1, wherein the display element is an organic light emitting diode and comprises:

a first electrode electrically connected to the thin film transistor;

a second electrode facing the first electrode; and an intermediate layer between the first electrode and the second electrode, wherein the intermediate layer comprises an organic emission layer.

15. A display device comprising:

a substrate;

a display unit comprising a thin film transistor and an organic light emitting diode (OLED) electrically connected to the thin film transistor, wherein the thin film transistor is disposed over the substrate, and the thin film transistor includes an active layer;

an insulating layer disposed over the active layer;

a first conductive member on the insulating layer that forms source electrodes and drain electrodes of the thin film transistor;

a first protection layer formed over and contacting the insulating layer and the source electrodes and drain electrodes of the thin film transistor;

a first planarization layer formed over the first protection layer;

a second conductive member formed over the first planarization layer;

a second protection layer formed over the second conductive member; and a second planarization layer formed over the second protection layer, wherein the OLED comprises a first electrode, a second electrode, and an intermediate layer disposed between the first electrode and the second electrode, and wherein both the first electrode and the second electrode are disposed over the second planarization layer.

16. The display device of claim 15, the display unit further comprising:

a storage capacitor with a first storage electrode and a second storage electrode, wherein the storage capacitor overlaps with the thin film transistor, the first storage electrode of the storage capacitor is a gate electrode of the thin film transistor, and the second storage electrode overlaps with the first storage electrode.

17. The display device of claim 15, wherein the display unit comprises a display area and a non-display area outside the display area, a dividing region of the display device divides each of the first planarization layer and the second planarization layer into a center portion and an outer portion, wherein the outer portion is disposed in the non-display area, and the first conductive member and the second conductive member are partially disposed in the dividing region.

18. The display device of claim 17, further comprising:

an encapsulation layer formed over the OLED, wherein the encapsulation layer directly contacts an exposed portion of the second conductive member in the dividing region of the display device.

* * * * *